United States Patent
Park (10) Patent No.: US 10,139,670 B2
(45) Date of Patent: Nov. 27, 2018

(54) DISPLAY PANEL AND DISPLAY DEVICE (71) Applicants: Boe Technology Group Co., Ltd., Beijing (CN); Hefei Boe Optoelectronics Technology Co., Ltd., Hefei, Anhui (CN)

(72) Inventor: Kuhyun Park, Beijing (CN)

(73) Assignees: BOE TECHNOLOGY GROUP CO., LTD., Chaoyang District, Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/912,858

(22) PCT Filed: Aug. 6, 2015

(86) PCT No.: PCT/CN2015/086246
§ 371 (c)(1),
(2) Date: Feb. 18, 2016

(87) PCT Pub. No.: WO2016/155180
PCT Pub. Date: Oct. 6, 2016

(65) Prior Publication Data
US 2017/0038638 A1    Feb. 9, 2017

(30) Foreign Application Priority Data
Apr. 1, 2015   (CN) .......................... 2015 1 0152765

(51) Int. Cl.
*G02F 1/1335*   (2006.01)
*G02F 1/1362*   (2006.01)
(Continued)

(52) U.S. Cl.
CPC ...... *G02F 1/133528* (2013.01); *G02F 1/1335* (2013.01); *G02F 1/1362* (2013.01);
(Continued)

(58) Field of Classification Search
CPC ......... G02F 1/133528; G02F 1/133536; G02F 1/1347; G02F 1/13471;
(Continued)

(56) References Cited

U.S. PATENT DOCUMENTS

2003/0231270 A1   12/2003   Kume et al.
2010/0091204 A1*  4/2010    Chen .................. G02B 27/2214
                                                                349/15
(Continued)

FOREIGN PATENT DOCUMENTS

CN   1629701 A   6/2005
CN   1800948 A   7/2006
(Continued)

OTHER PUBLICATIONS

Office Action in Chinese Application No. 201510152765.1 dated Mar. 22, 2017, with English translation. 11 pages.
(Continued)

*Primary Examiner* — Nathanael R Briggs
*Assistant Examiner* — William Peterson
(74) *Attorney, Agent, or Firm* — Womble Bond Dickinson (US) LLP (57) ABSTRACT

The embodiment of the present invention provides a display panel, which belongs to the field of display technology. The display panel comprises: a first polarizing layer, a display substrate, a second polarizing layer and a phase difference film; wherein the first polarizing layer is arranged at one side of the display substrate, and the first polarizing layer is arranged between the second polarizing layer and the display substrate, a transmission axis direction of the first polarizing layer and a transmission axis direction of the second polarizing layer are perpendicular to each other; the phase difference film is arranged between the first polarizing layer and the second polarizing layer. The present invention
(Continued)

arranges a second polarizing layer and a phase difference film on the basis of the existing display panel, such that only the linearly polarized light whose polarizing direction is parallel to the transmission axis direction of the second polarizing layer can be emitted from the display panel, hence, the user whose viewing angle is perpendicular to the display panel can see the content in the display panel, while the user whose viewing angle is in other directions cannot see the contents in the display panel, thereby protecting the user's privacy effectively.

20 Claims, 10 Drawing Sheets (51) Int. Cl.
*G02F 1/1333* (2006.01)
*G02F 1/13363* (2006.01)
*H01L 51/52* (2006.01)
*G02F 1/1368* (2006.01)

(52) U.S. Cl.
CPC .... *G02F 1/13363* (2013.01); *G02F 1/133308* (2013.01); *H01L 51/5281* (2013.01); *G02F 1/1368* (2013.01); *G02F 1/13338* (2013.01); *G02F 2001/133331* (2013.01); *G02F 2001/133531* (2013.01); *G02F 2001/133562* (2013.01); *G02F 2001/133567* (2013.01); *G02F 2413/01* (2013.01)

(58) Field of Classification Search
CPC ....... G02F 2001/133565; G02F 1/1335; G02F 1/1362; G02F 1/133308; G02F 1/13338; G02F 1/13363; G02F 1/1368; G02F 2001/133331; G02F 2001/133531; G02F 2001/133562; G02F 2001/133567; G02F 2413/01; H01L 51/5281

USPC .......................................................... 349/96
See application file for complete search history.

(56) References Cited

U.S. PATENT DOCUMENTS

2012/0075557 A1* 3/2012 Hong ................ G02F 1/133524
                                                              349/96
2014/0176859 A1   6/2014 Lin et al.

FOREIGN PATENT DOCUMENTS

| CN | 101479654 A | | 7/2009 |
|---|---|---|---|
| CN | 101681061 A | * | 3/2010 |
| CN | 101681061 A | | 3/2010 |
| CN | 101750817 | | 6/2010 |
| CN | 101881916 | | 11/2010 |
| CN | 102081255 | | 6/2011 |
| CN | 104730758 | | 6/2015 |

OTHER PUBLICATIONS

International Search Report and Written Opinion with English Language Translation, dated Dec. 28, 2015, Application No. PCT/CN2015/086246.
Office Action received for Chinese Patent Application No. 201510152765.1, dated Dec. 19, 2017, 21 pages (13 pages of English Translation and 8 pages of Office Action).
International Preliminary Report on Patentability received for PCT Patent Application No. PCT/CN2015/086246, dated Oct. 12, 2017, 14 pages (8 pages of English Translation and 6 pages of Original Document).
"Decision on Rejection," CN Application No. 201510152765.1 (dated May 23, 2018).

* cited by examiner

DISPLAY PANEL AND DISPLAY DEVICE

FIELD OF THE INVENTION

The present invention relates to the field of display technology, particularly to a display panel and a display device.

BACKGROUND OF THE INVENTION

With the development of the display technology, various displays have been widely used in daily life, for example, smart phones with display screens, panel computers, MP3 (Moving Picture Experts Group Audio Layer III) etc. At present, the display panel of the mainstream display mainly has two types, one is liquid crystal display panel, the other is OLED (organic Light-Emitting Diode) display panel.

Figure 1:
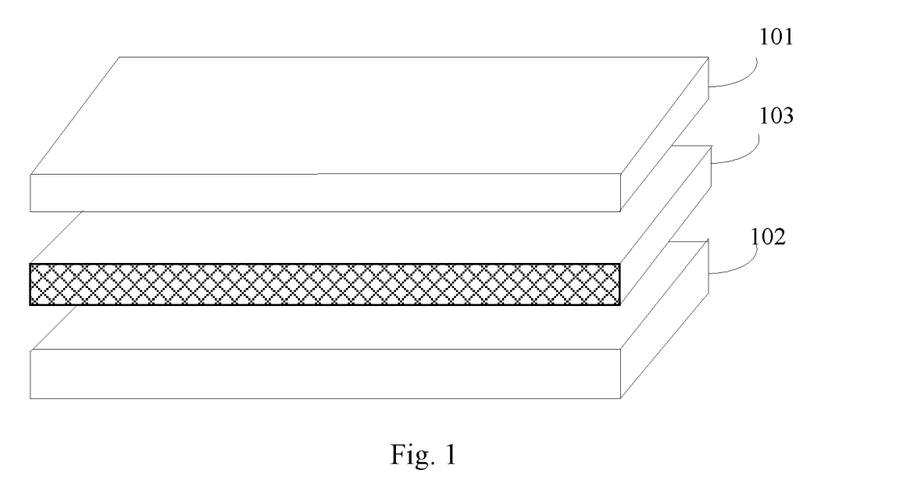
FIG. 1 is a structural schematic view of an existing display panel.

Take the LCD display panel as the example, the display mode of the existing LCD display panel is generally the TN (Twisted Nematic) mode. Referring to FIG. 1, the display panel comprises an upper polarizing layer 101, a lower polarizing layer 102 and a liquid crystal display substrate 103. Wherein the upper polarizing layer 101 and the lower polarizing layer 102 are located at two sides of the liquid crystal display substrate 103, and the transmission axis directions of the upper polarizing layer 101 and the lower polarizing layer 102 are perpendicular to each other. When the incident light enters the display panel through the lower polarizing layer 102, the light component in the incident light parallel to the transmission axis direction of the second polarizing layer 102 can pass through the lower polarizing layer 102. Since the liquid crystal molecules are in helical arrangement, the angle between the base layer liquid crystal molecules and the top layer liquid crystal molecules is 90 degrees, when the light component that passes through the second polarizing layer 102 is incident on the liquid crystal display substrate, the polarizing direction of this light component will rotate for 90 degrees, i.e., the polarizing direction of this light component after rotation is parallel to the transmission axis direction of the upper polarizing layer 101, here all the light components can pass through the upper polarizing layer 101, the display mode of the display panel is wide viewing angle.

In the process of carrying out the present invention, the inventor finds that the related art at least has the following problems:

When the display mode of the display panel is the wide viewing angle mode, if the user uses devices with display screens such as smart phones, panel computers in public, the users around may see the contents on the display screens of these devices, such that the user's privacy may be leaked.

SUMMARY OF THE INVENTION

In order to solve the problem of the related art, the embodiments of the present invention provide a display panel and a display device. The technical solutions are as follows:

On a first aspect, a display panel is provided, the display panel comprises: a first polarizing layer, a display substrate, a second polarizing layer and a phase difference film;

wherein the first polarizing layer is arranged at one side of the display substrate, and the first polarizing layer is arranged between the second polarizing layer and the display substrate, a transmission axis direction of the first polarizing layer and a transmission axis direction of the second polarizing layer are perpendicular to each other;

the phase difference film is arranged between the first polarizing layer and the second polarizing layer.

Combined with the first aspect, in a first possible implementing mode of the first aspect, the display substrate is a liquid crystal display substrate, the display mode of the liquid crystal display substrate is an Advanced Super Dimension Switch (ADS) mode or a Twisted Nematic (TN) mode.

Combined with the first possible implementing mode of the first aspect, in a second possible implementing mode of the first aspect, the display panel further comprises a third polarizing layer;

wherein the first polarizing layer is arranged at a light exit side of the display substrate, the second polarizing layer is arranged at a light exit side of the first polarizing layer;

the third polarizing layer is arranged at a light entrance side of the display substrate, a transmission axis direction of the third polarizing layer and the transmission axis direction of the first polarizing layer are perpendicular to each other.

Combined with the first possible implementing mode of the first aspect, in a third possible implementing mode of the first aspect, the display panel further comprises a third polarizing layer;

wherein the first polarizing layer is arranged at a light entrance side of the display substrate, the second polarizing layer is arranged at a light entrance side of the first polarizing layer;

the third polarizing layer is arranged at a light exit side of the display substrate, a transmission axis direction of the third polarizing layer and the transmission axis direction of the first polarizing layer are perpendicular with each other.

Combined with the first aspect, in a fourth possible implementing mode of the first aspect, the display substrate is an OLED display substrate.

Combined with the fourth possible implementing mode of the first aspect, in a fifth possible implementing mode of the first aspect, the first polarizing layer is arranged at a light exit side of the display substrate, the second polarizing layer is arranged at a light exit side of the first polarizing layer.

Combined with the second possible implementing mode of the first aspect or the fifth possible implementing mode of the first aspect, in a sixth possible implementing mode of the first aspect, the display panel further comprises an optical substrate;

wherein the optical substrate is arranged at a light exit side of the second polarizing layer or arranged between the light exit side of the first polarizing layer and the phase difference film.

Combined with the third possible implementing mode of the first aspect, in a seventh possible implementing mode of the first aspect, the display panel further comprises an optical substrate;

wherein the optical substrate is arranged at a light exit side of the third polarizing layer.

Combined with the sixth possible implementing mode of the first aspect or the seventh possible implementing mode of the first aspect, in a eighth possible implementing mode of the first aspect, the optical substrate is a touch plate or protective glass.

Combined with the first aspect, in a ninth possible implementing mode of the first aspect, the phase difference film is a uniaxial phase difference film.

Combined with the first aspect, in a tenth possible implementing mode of the first aspect, the thickness of the phase difference film is 90 nm~320 nm.

On a second aspect, a display device is provided, the display device comprising a display panel as stated in the first aspect.

The beneficial effects brought by the technical solutions provided by the embodiments of the present invention are:

On the basis of the existing display panel, a second polarizing layer and a phase difference film are arranged, such that only the linearly polarized light whose polarizing direction is parallel to the transmission axis direction of the second polarizing layer can be emitted from the display panel, hence, the user whose viewing angle is perpendicular to the display panel can see the content in the display panel, while the user whose viewing angle is in other directions cannot see the contents in the display panel, thereby protecting the user's privacy effectively.

BRIEF DESCRIPTION OF THE DRAWINGS

In order to explain the technical solutions in the embodiments of the present invention more clearly, next, the drawings to be used in describing the embodiments will be introduced briefly, apparently, the drawings described below are only some embodiments of the present invention, for the ordinary skilled person in the art, on the premise of not paying any creative work, other drawings can also be obtained based on these drawings.

DETAILED DESCRIPTION OF THE INVENTION

In order to make the purposes, the technical solutions and the advantages of the present invention clearer, next, the implementing modes of the present invention will be described in more details with reference to the drawings.

With the development of the information technology, information security has become an issue particularly concerned by the user. The existing display panel generally arranges a polarizing layer at one side of the display substrate, when the incident light passes through the polarizing layer, the incident light from various directions can be emitted from the polarity layer, the display panel runs in a wide viewing angle mode, thus the user's privacy cannot be protected perfectly.

Figure 2:
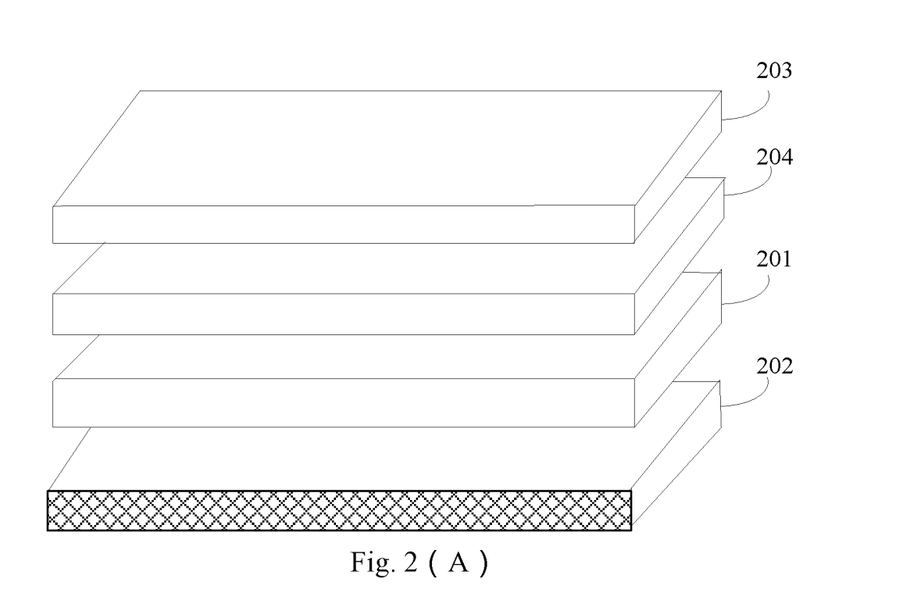
FIG. 2(A) is a structural schematic view of a display panel provided by an embodiment of the present invention.
FIG. 2(B) is a structural schematic view of a display panel provided by another embodiment of the present invention.

In order to solve said technical problem, an embodiment of the present invention provides a display panel. As shown in FIGS. 2(A) and 2(B), the display panel comprises: a first polarizing layer 201, a display substrate 202, a second polarizing layer 203 and a phase different film 204.

Wherein, the first polarizing layer 201 is arranged at one side of the display substrate 202, and the first polarizing layer 201 is arranged between the second polarizing layer 203 and the display substrate 202, the transmission axis direction of the first polarizing layer 201 and the transmission axis direction of the second polarizing layer 203 are perpendicular to each other; the phase difference film 204 is arranged between the first polarizing layer 201 and the second polarizing layer 203.

In the display field, the display substrate generally has two sides, which are respectively the light entrance side and the light exit side, and the first polarizing layer 201 can be either arranged at the light entrance side of the display substrate 202 or arranged at the light exit side of the display substrate 202. With respect to different positional relationships between the first polarizing layer 201 and the display substrate 202, the structure of the display panel provided by this embodiment is also different.

In an embodiment of the present invention, as shown in FIG. 2(A), the first polarizing layer 201 is arranged at the light exit side of the display substrate 202, the second polarizing layer 203 is arranged at the light exit side of the first polarizing layer 201, the phase difference film 204 is arranged between the light exit side of the first polarizing layer 201 and the light entrance side of the second polarizing layer 203.

In another embodiment of the present invention, as shown in FIG. 2(B), the first polarizing layer 201 is arranged at the light entrance side of the display panel 202, the second polarizing layer 203 is arranged at the light entrance side of the first polarizing layer 201, the phase difference film 204 is arranged between the light entrance side of the first polarizing layer 201 and the light exit side of the second polarizing layer 203.

The display panel provided by the embodiment of the present invention arranges a second polarizing layer and a phase difference film on the basis of the existing display panel, such that only the linearly polarized light whose polarizing direction is parallel to the transmission axis direction of the second polarizing layer can be emitted from the display panel. Hence, the user whose viewing angle is perpendicular to the display panel can see the content in the display panel, while the user whose viewing angle is in other directions cannot see the contents in the display panel, thereby protecting the user's privacy effectively.

As shown in FIG. 2(A), an embodiment of the present invention provides a display panel comprising: a first polarizing layer 201, a display substrate 202, a second polarizing layer 203 and a phase difference film 204. This embodiment takes the example that the display substrate 202 is a liquid crystal display substrate for explanation. Wherein, the first polarizing layer 201 is arranged at the light exit side of the liquid crystal display substrate 202, the second polarizing layer 203 is arranged at the light exit side of the first polarizing layer 201, the phase difference film 204 is arranged between the light exit side of the first polarizing layer 201 and the light entrance side of the second polarizing layer 203.

In the display field, the polarizing layer generally consists of a polarizer. Since the polarizer has a transmission axis, only the incident light whose polarizing direction is parallel to the transmission axis direction is allowed to be emitted, hence, when the incident light passes through the polarizing layer, if the polarizing direction of the incident light is parallel to the transmission axis direction of the polarizing layer, the incident light can all pass through the polarizing layer; if the polarizing direction of the incident light is perpendicular to the transmission axis direction of the polarizing layer, partial light component of the incident light can pass through the polarizing layer, moreover, the polarizing direction of the partial light component is parallel to the transmission axis direction of the polarizing layer. In addition, the polarizing layer also has good absorption, scattering and reflective characteristics, and can hide the incident light that cannot be transmitted through absorption, scattering and reflection, so as to control the display effect of the image.

Since a plurality of polarizing layers are involved in this embodiment, in order to distinguish these polarizing layers, this embodiment divides the polarizing layers into a first polarizing layer 201 and a second polarizing layer 203 according to different positions of the respective polarizing layers in the display panel. In this embodiment, the transmission axis direction of the first polarizing layer 201 and the transmission axis direction of the second polarizing layer 203 are perpendicular to each other, when the angle between the transmission axis direction of the first polarizing layer 201 and the horizontal direction is 90 degrees, the angle between the transmission axis direction of the second polarizing layer 203 and the horizontal direction is 0 degree; when the angle between the transmission axis direction of the first polarizing layer 201 and the horizontal direction is 0 degree, the angle between the transmission axis direction of the second polarizing layer 203 and the horizontal direction is 90 degrees.

In this embodiment, the liquid crystal display substrate 202 has a liquid crystal material of dielectric anisotropy and optical anisotropy, and a pixel electrode and a common electrode for generating an electric field so as to drive the liquid crystal material. The display modes of the liquid crystal display substrate can be the ADS mode, the TN mode etc. The TN mode is the most representative display mode in the current display field, the liquid crystal molecules in the liquid crystal material under the TN mode are in spiral arrangement, the angle between the bottom liquid crystal molecules and the top liquid crystal molecules are 90 degrees. The pixel electrode is connected with a thin film transistor (TFT). The pixel electrode and the common electrode can be perpendicularly or horizontally arranged, so that they can generate an electric field in perpendicular or horizontal direction. When the pixel electrode and the common electrode are arranged on substrates opposite to each other at two sides of the liquid crystal material, a perpendicular electric field can be generated; when the pixel electrode and the common electrode are arranged on the same substrate, a horizontal electric field can be generated.

In this embodiment, the phase difference film 204 is a uniaxial phase difference film, which is constituted by uniaxial birefringent crystals. The thickness of the phase difference film 204 is 90 nm~320 nm, in actual applications, the phase difference film 204 is generally a quarter wave plate or a half wave plate etc. From the property of the uniaxial birefringent crystal in physics it can be seen that the phase difference film 204 can change the polarizing direction of the incident light by changing the phase of the incident light. The delayed phase difference of the uniaxial birefringent crystal is:

$$\Delta\phi = \frac{2\Pi}{\lambda}(n_o - n_e)d;$$

Wherein $\Delta\phi$ is the delayed phase difference of the uniaxial birefringent crystal, $\Delta$ is the wavelength of the incident light, $n_o$ is the refractive index of ordinary light, $n_e$ is the refractive index of extraordinary light, d is the thickness of the uniaxial birefringent crystal.

Figure 3:
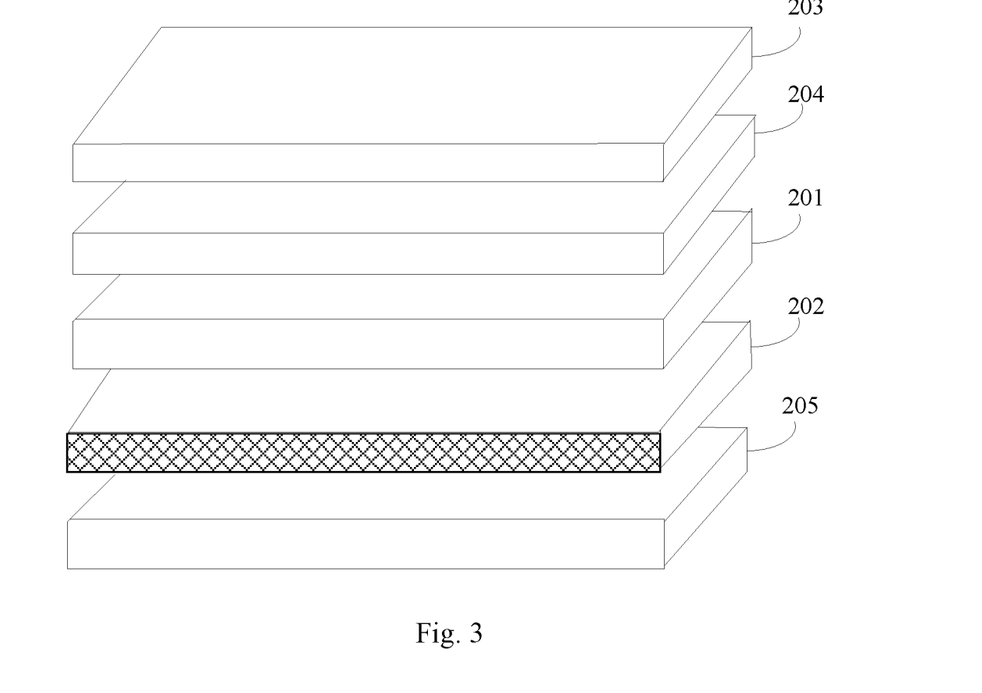
FIG. 3 is a structural schematic view of a display panel provided by another embodiment of the present invention.

Referring to FIG. 3, the display panel provided by an embodiment of the present invention can further comprise a third polarizing layer 205, the transmission axis direction of the third polarizing layer 205 and the transmission axis direction of the first polarizing layer 201 are perpendicular to each other. When the angle between the transmission axis direction of the first polarizing direction 201 and the horizontal direction is 90 degrees, the angle between the transmission axis direction of the third polarizing direction and the horizontal direction is 0 degree; when the angle between the transmission axis direction of the first polarizing direction 201 and the horizontal direction is 0 degree, the angle between the transmission axis direction of the third polarizing direction and the horizontal direction is 90 degrees. From FIG. 3 it can be seen that the first polarizing layer 201 is arranged at the light exit side of the liquid crystal display substrate 202, the second polarizing layer 203 is arranged at the light exit side of the first polarizing layer 201, the third polarizing layer 205 is arranged at the light entrance side of the liquid crystal display substrate 202, here, the phase difference film 204 is arranged between the light exit side of the first polarizing layer 201 and the light entrance side of the second polarizing layer 203.

Figure 4:
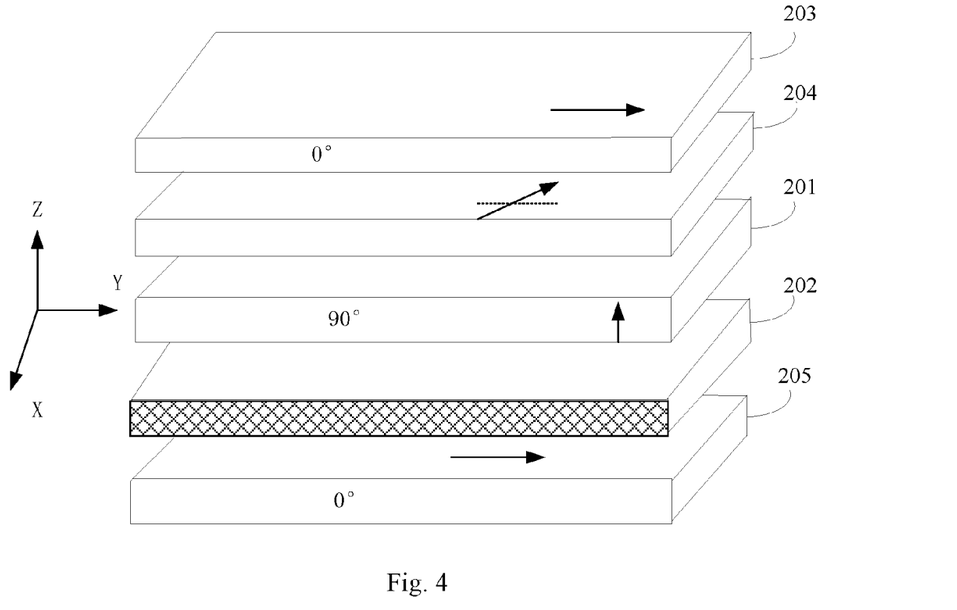
FIG. 4 is a structural schematic view of a display panel provided by another embodiment of the present invention.

FIG. 4 is a narrow viewing angle mode shown according to an embodiment of the present invention. Referring to FIG. 4, which takes the example that the angle between the transmission axis direction of the first polarizing layer 201 and the horizontal direction is 90 degrees, the angle between the transmission axis direction of the second polarizing layer 203 and the horizontal direction is 0 degree, the angle between the transmission axis direction of the third polarizing layer 205 and the horizontal direction is 0 degree, and the phase difference film 204 is a quarter wave plate. When the natural light is incident on the display panel as shown in FIG. 4 through the third polarizing layer 205, the natural light becomes a first linearly polarized light whose polarizing direction is at an angle of 0 degree with the horizontal direction, when it passes through the liquid crystal display substrate 202, under the effect of the liquid crystal molecules, the polarizing direction of the first linearly polarized light rotates for 90 degrees, which becomes a second linearly polarized light whose polarizing direction is at an angle of 90 degrees with the horizontal direction, after the second linearly polarized light passes through the phase difference film 204, a third polarized light whose polarizing direction is at a certain angle with the horizontal direction is obtained, when the third polarized light passes through the third polarizing layer 205, the polarizing direction of the third polarized light is not parallel to the transmission axis direction of the third polarizing layer 205, in the third polarized light, only the light component whose polarizing direction is parallel to the transmission axis direction of the third polarizing layer 205 can pass through the third polarizing layer. Here, the display panel runs in the narrow viewing angle mode, only the user whose viewing angle is perpendicular to the display panel can see the content in the display panel.

Figure 5:
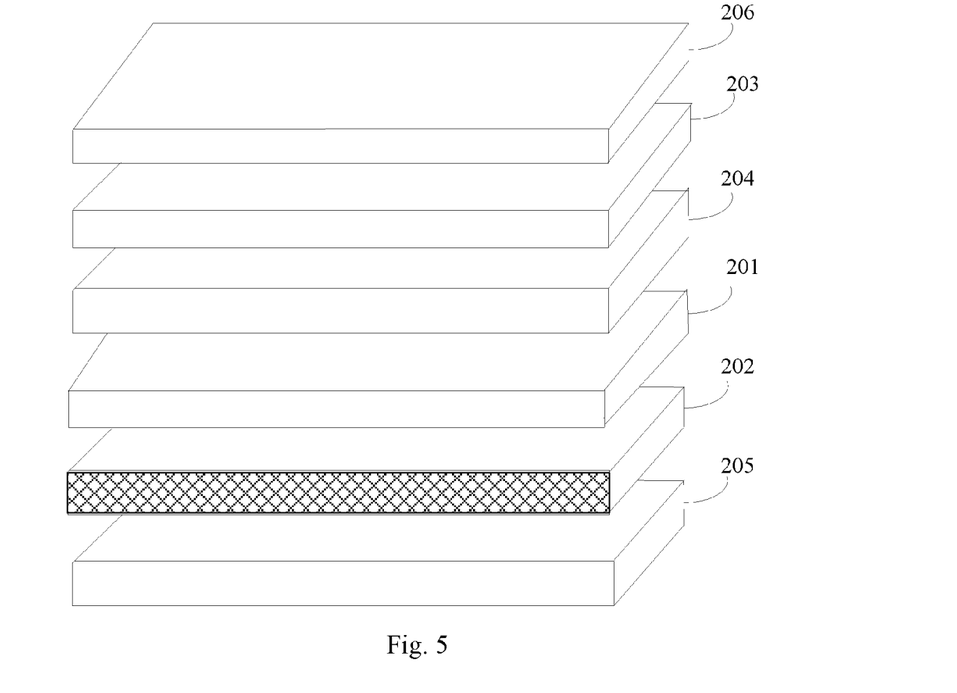
FIG. 5 is a structural schematic view of a display panel provided by another embodiment of the present invention.
Figure 6:
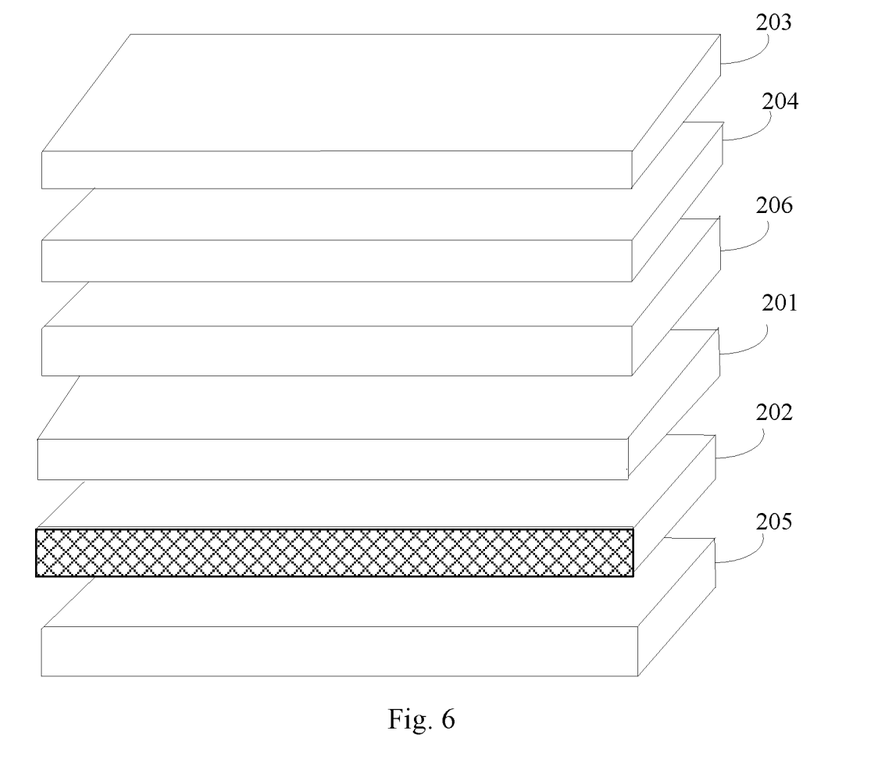
FIG. 6 is a structural schematic view of a display panel provided by another embodiment of the present invention.

Based on the display panel as shown in FIG. 3, the display panel provided by the embodiment of the present invention can further comprise an optical substrate 206, the optical substrate has the functions of protecting the display panel from being damaged and increasing the transmittance of the incident light etc. The optical substrate 206 can be a touch plate, and can also be protective glass, the embodiment of the present invention does not define the optical substrate 206 specifically. Referring to FIG. 5, the optical substrate 206 can be arranged at the light exit side of the second polarizing layer 203. Referring to FIG. 6, the optical substrate 206 can also be arranged between the light exit light of the first polarizing layer 201 and the phase difference film 204.

In addition, in order to control brightness distribution on the display panel, the angle between the optical axis direction of the phase difference film 204 and the horizontal direction can select an appropriate value based on needs, for example, it can select any angle in the range of 0°~45°.

Figure 7:
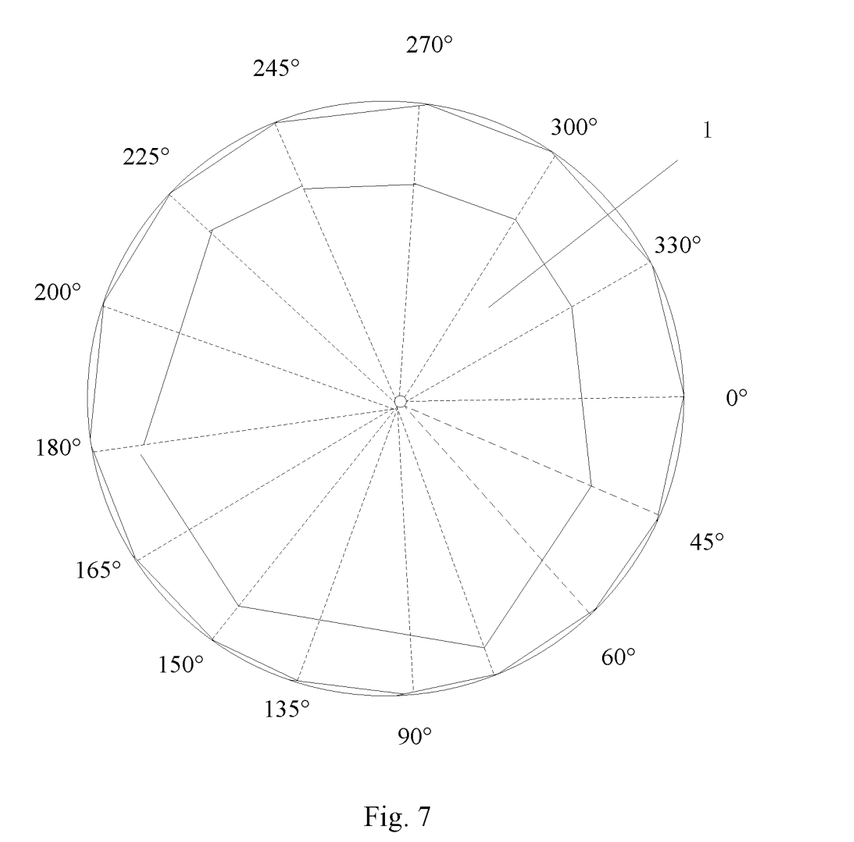
FIG. 7 is a viewing angle map of an existing display panel.
Figure 8:
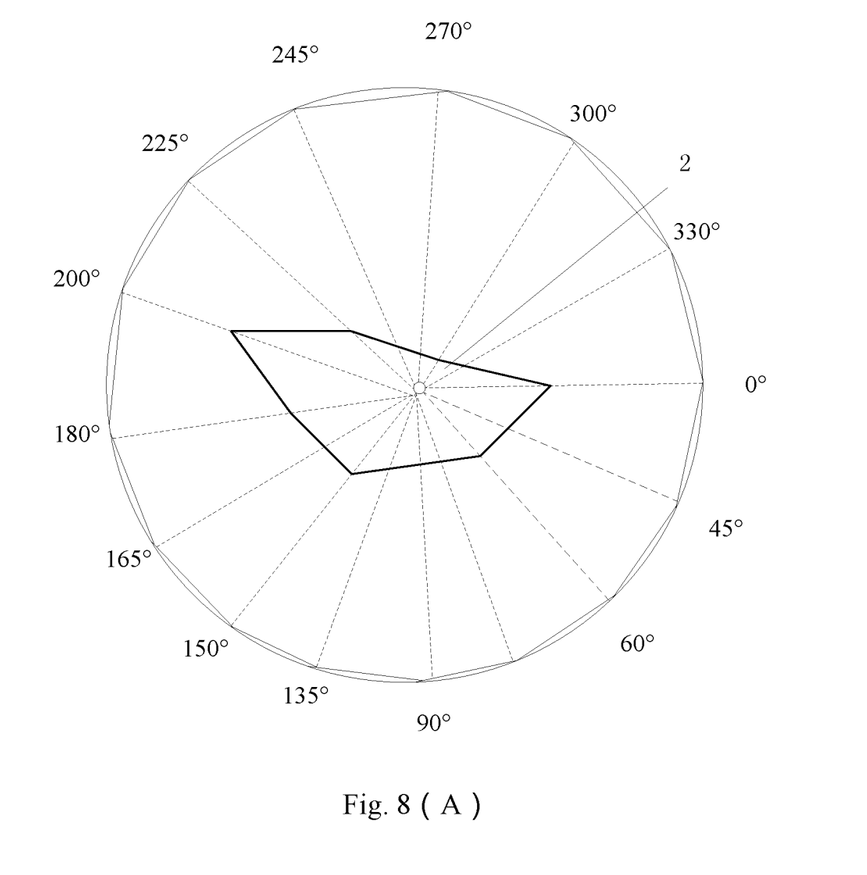
FIG. 8(A) is a viewing angle map of a display panel provided by an embodiment of the present invention.
FIG. 8(B) is a viewing angle map of a display panel provided by an embodiment of the present invention.

FIG. 7 is a viewing angle map of an existing display panel, FIGS. 8(A) and 8(B) are viewing angle maps of the display panel provided by the embodiment of the present invention. Wherein the viewing angle range of the existing display panel is the region indicated by 1 in FIG. 7, the viewing angle range of the display panel provided by the embodiment of the present invention is the region indicated by 2 in FIG. 8(A) and the region indicted by 3 in FIG. 8(B). Through the comparison between the viewing angle map of the existing display panel and the viewing angle map of the display panel provided by the embodiment of the present invention it can be found that the viewing angle of the display panel will be reduced greatly when using the display panel provided by the embodiment of the present invention.

The display panel provided by the embodiment of the present invention arranges a second polarizing layer and a phase difference film on the basis of the existing display panel, such that only the linearly polarized light whose polarizing direction is parallel to the transmission axis direction of the second polarizing layer can be emitted from the display panel. Hence, the user whose viewing angle is perpendicular to the display panel can see the content in the display panel, while the user whose viewing angle is in other directions cannot see the contents in the display panel, thereby protecting the user's privacy effectively.

As shown in FIG. 2(B), an embodiment of the present invention provides a display panel comprising: a first polarizing layer 201, a display substrate 202, a second polarizing layer 203 and a phase difference film 204. This embodiment takes the example that the display substrate 202 is a liquid crystal display substrate for explanation. Wherein, the first polarizing layer 201 is arranged at the light entrance side of the liquid crystal display substrate 202, the second polarizing layer 203 is arranged at the light entrance side of the first polarizing layer 201, the phase difference film 204 is arranged between the light entrance side of the first polarizing layer 201 and the light exit side of the second polarizing layer 203.

In the display field, the polarizing layer generally consists of a polarizer. Since the polarizer has a transmission axis, only the incident light whose polarizing direction is parallel to the transmission axis direction is allowed to be emitted, hence, when the incident light passes through the polarizing layer, if the polarizing direction of the incident light is parallel to the transmission axis direction of the polarizing layer, the incident light can all pass through the polarizing layer; if the polarizing direction of the incident light is perpendicular to the transmission axis direction of the polarizing layer, the incident light cannot pass through the polarizing layer; if the polarizing direction of the incident light and the transmission axis direction of the polarizing layer form a certain angle, partial light component of the incident light can pass through the polarizing layer, moreover, the polarizing direction of the partial light component is parallel to the transmission axis direction of the polarizing layer. In addition, the polarizing layer also has good absorption, scattering and reflective characteristics, and can hide the incident light that cannot be transmitted through the functions of absorption, scattering and reflection, so as to control the display effect of the image.

Since a plurality of polarizing layers are involved in this embodiment, in order to distinguish these polarizing layers, this embodiment divides the polarizing layers into a first polarizing layer 201 and a second polarizing layer 203 according to different positions of the respective polarizing layers in the display panel. In this embodiment, the transmission axis direction of the first polarizing layer 201 and the transmission axis direction of the second polarizing layer 203 are perpendicular to each other, when the angle between the transmission axis direction of the first polarizing layer 201 and the horizontal direction is 90 degrees, the angle between the transmission axis direction of the second polarizing layer 203 and the horizontal direction is 0 degree; when the angle between the transmission axis direction of the first polarizing layer 201 and the horizontal direction is 0 degree, the angle between the transmission axis direction of the second polarizing layer 203 and the horizontal direction is 90 degrees.

In this embodiment, the liquid crystal display substrate 202 has a liquid crystal material of dielectric anisotropy and optical anisotropy, and a pixel electrode and a common electrode for generating an electric field so as to drive the liquid crystal material. The display modes of the liquid crystal display substrate can be the ADS mode, the TN mode etc. The TN mode is the most representative display mode in the current display field, the liquid crystal molecules in the liquid crystal material under the TN mode are in spiral arrangement, the angle between the bottom liquid crystal molecules and the top liquid crystal molecules are 90 degrees. The pixel electrode is connected with a thin film transistor (TFT). The pixel electrode and the common electrode can be perpendicularly or horizontally arranged, so that they can generate an electric field in perpendicular or horizontal direction. When the pixel electrode and the common electrode are arranged on substrates opposite to each other at two sides of the liquid crystal material, a perpendicular electric field can be generated; when the pixel electrode and the common electrode are arranged on the same substrate, a horizontal electric field can be generated.

In this embodiment, the phase difference film 204 is a uniaxial phase difference film, which is constituted by uniaxial birefringent crystals. The thickness of the phase difference film 204 is 90 nm~320 nm, in actual applications, the phase difference film 204 is generally a quarter wave plate or a half wave plate etc. From the property of the uniaxial birefringent crystal in physics it can be seen that the phase difference film 204 can change the polarizing direction of the incident light by changing the phase of the incident light. The delayed phase difference of the uniaxial birefringent crystal is:

$$\Delta \phi = \frac{2\Pi}{\lambda}(n_o - n_e)d;$$

Wherein $\Delta\phi$ is the delayed phase difference of the uniaxial birefringent crystal, $\lambda$ is the wavelength of the incident light, $n_o$ is the refractive index of ordinary light, $n_e$ is the refractive index of extraordinary light, d is the thickness of the uniaxial birefringent crystal.

Figure 9:
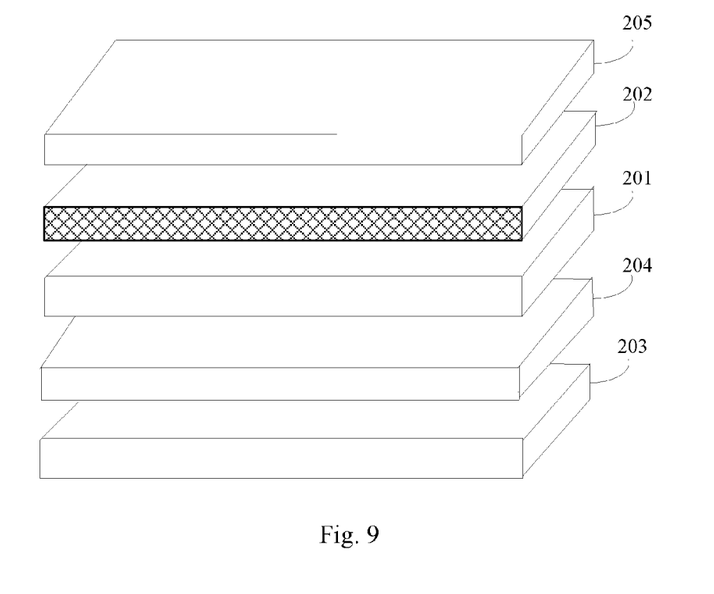
FIG. 9 is a structural schematic view of a display panel provided by another embodiment of the present invention.

Referring to FIG. 9, the display panel provided by an embodiment of the present invention can further comprise a third polarizing layer 205, the transmission axis direction of the third polarizing layer 205 and the transmission axis direction of the first polarizing layer 201 are perpendicular to each other. When the angle between the transmission axis direction of the first polarizing direction 201 and the horizontal direction is 90 degrees, the angle between the transmission axis direction of the third polarizing direction and the horizontal direction is 0 degree; when the angle between the transmission axis direction of the first polarizing direction 201 and the horizontal direction is 0 degree, the angle between the transmission axis direction of the third polarizing direction and the horizontal direction is 90 degrees. From FIG. 9 it can be seen that the first polarizing layer 201 is arranged at the light entrance side of the liquid crystal display substrate 202, the second polarizing layer 203 is arranged at the light entrance side of the first polarizing layer 201, the third polarizing layer 205 is arranged at the light exit side of the liquid crystal display substrate 202, here, the phase difference film 204 is arranged between the light entrance side of the first polarizing layer 201 and the light exit side of the second polarizing layer 203.

Figure 10:
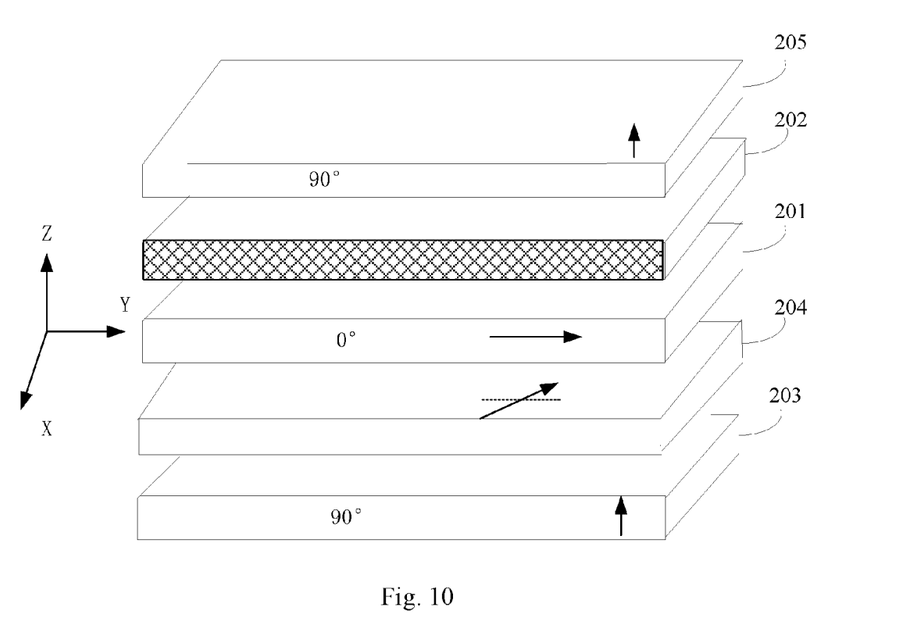
FIG. 10 is a structural schematic view of a display panel provided by another embodiment of the present invention.

FIG. 10 is a narrow viewing angle mode shown according to an embodiment of the present invention. Referring to FIG. 10, which takes the example that the angle between the transmission axis direction of the first polarizing layer 201 and the horizontal direction is 0 degree, the angle between the transmission axis direction of the second polarizing layer 203 and the horizontal direction is 90 degrees, the angle between the transmission axis direction of the third polarizing layer 205 and the horizontal direction is 90 degrees, and the phase difference film 204 is a quarter wave plate. When the natural light is incident on the display panel as shown in FIG. 10 through the second polarizing layer 203, the natural light becomes a first linearly polarized light whose polarizing direction is at an angle of 90 degrees with the horizontal direction, when the first linearly polarized light passes through the phase difference film 204, the polarizing direction of the first linearly polarized light will be changed to obtain a second linearly polarized light whose polarizing direction is at a certain angle with the horizontal direction, after the second linearly polarized light passes through the first polarizing layer 201, in the second polarized light, only the light component whose polarizing direction is parallel to the transmission axis direction of the first polarizing layer 201 can pass through the first polarizing layer 201, if the light component that passes through the first polarizing layer 201 is called a third polarized light, the angle between the polarizing direction of the third polarized light and the horizontal direction is 0 degree, when the third polarized light passes through the liquid crystal display substrate 202, under the effect of the liquid crystal molecules, the polarizing direction of the third polarized light rotates for 90 degrees to obtain a fourth polarized light, here, the angle between the polarizing direction of the fourth polarized light and the horizontal direction is 90 degrees. When the fourth polarized light passes through the third polarizing layer 205, the polarizing direction of the fourth polarized light is parallel to the transmission axis direction of the third polarizing layer 205, it can pass through the third polarizing layer 205, here, the display panel runs in the narrow viewing angle mode, only the user whose viewing angle is perpendicular to the display panel can see the content in the display panel.

Figure 11:
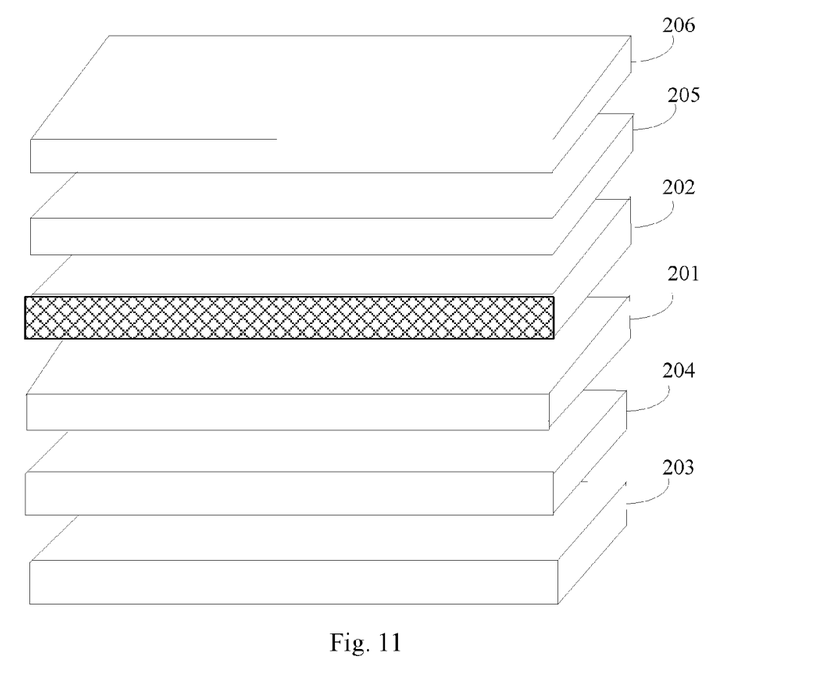
FIG. 11 is a structural schematic view of a display panel provided by another embodiment of the present invention.

Based on the display panel as shown in FIG. 9, the display panel provided by the embodiment of the present invention can further comprise an optical substrate 206, the optical substrate has the functions of protecting the display panel from being damaged and increasing the transmittance of the incident light etc. The optical substrate 206 can be a touch plate, and can also be protective glass, the embodiment of the present invention does not define the optical substrate 206 specifically. Referring to FIG. 11, the optical substrate 206 can be arranged at the light exit side of the third polarizing layer 205.

In addition, in order to control brightness distribution on the display panel, the angle between the optical axis direction of the phase difference film 204 and the horizontal direction can select an appropriate value based on needs, for example, it can select any angle in the range of 0°~45°.

The display panel provided by the embodiment of the present invention arranges a second polarizing layer and a phase difference film on the basis of the existing display panel, such that only the linearly polarized light whose polarizing direction is parallel to the transmission axis direction of the second polarizing layer can be emitted from the display panel. Hence, the user whose viewing angle is perpendicular to the display panel can see the content in the display panel, while the user whose viewing angle is in other directions cannot see the contents in the display panel, thereby protecting the user's privacy effectively.

As shown in FIG. 2(A), an embodiment of the present invention further provides a display panel comprising: a first polarizing layer 201, a display substrate 202, a second polarizing layer 203 and a phase difference film 204. This embodiment takes the example that the display substrate 202 is an OLED display substrate. Wherein the first polarizing layer 201 is arranged at the light exit light of the OLED display substrate 202, the second polarizing layer 203 is arranged at the light exit side of the first polarizing layer 201, the phase difference film 204 is arranged between the light exit side of the first polarizing layer 201 and the light entrance side of the second polarizing layer 203.

In the display field, the polarizing layer generally consists of a polarizer. Since the polarizer has a transmission axis, only the incident light whose polarizing direction is parallel to the transmission axis direction is allowed to be emitted, hence, when the incident light passes through the polarizing layer, if the polarizing direction of the incident light is parallel to the transmission axis direction of the polarizing layer, the incident light can all pass through the polarizing layer; if the polarizing direction of the incident light is perpendicular to the transmission axis direction of the polarizing layer, the incident light cannot pass through the polarizing layer; if the polarizing direction of the incident light and the transmission axis direction of the polarizing layer form a certain angle, partial light component of the incident light can pass through the polarizing layer, moreover, the polarizing direction of the partial light component is parallel to the transmission axis direction of the polarizing layer. In addition, the polarizing layer also has good absorption, scattering and reflective characteristics, and can hide the incident light that cannot be transmitted through the functions of absorption, scattering and reflection, so as to control the display effect of the image.

Since a plurality of polarizing layers are involved in this embodiment, in order to distinguish these polarizing layers, this embodiment divides the polarizing layers into a first polarizing layer 201 and a second polarizing layer 203 according to different positions of the respective polarizing layers in the display panel. In this embodiment, the transmission axis direction of the first polarizing layer 201 and the transmission axis direction of the second polarizing layer 203 are perpendicular to each other, when the angle between the transmission axis direction of the first polarizing layer 201 and the horizontal direction is 90 degrees, the angle between the transmission axis direction of the second polarizing layer 203 and the horizontal direction is 0 degree; when the angle between the transmission axis direction of the first polarizing layer 201 and the horizontal direction is 0 degree, the angle between the transmission axis direction of the second polarizing layer 203 and the horizontal direction is 90 degrees.

In this embodiment, the OLED display substrate has the advantages of being self-luminous, high response speed, high color gamut, wide viewing angle, ultrathinness, low power consumption and so on, it can be widely applied in lighting, large-size television, flexible mobile phone etc.

In this embodiment, the phase difference film 204 is a uniaxial phase difference film, which is constituted by uniaxial birefringent crystals. The thickness of the phase difference film 204 is 90 nm~320 nm, in actual applications, the phase difference film 204 is generally a quarter wave plate or a half wave plate etc. From the property of the uniaxial birefringent crystal in physics it can be seen that the phase difference film 204 can change the polarizing direction of the incident light by changing the phase of the incident light. The delayed phase difference of the uniaxial birefringent crystal is:

$$\Delta\phi = \frac{2\Pi}{\lambda}(n_o - n_e)d;$$

Wherein $\Delta\phi$ is the delayed phase difference of the uniaxial birefringent crystal, $\Delta$ is the wavelength of the incident light, $n_o$ is the refractive index of ordinary light, $n_e$ is the refractive index of extraordinary light, d is the thickness of the uniaxial birefringent crystal.

Figure 12:
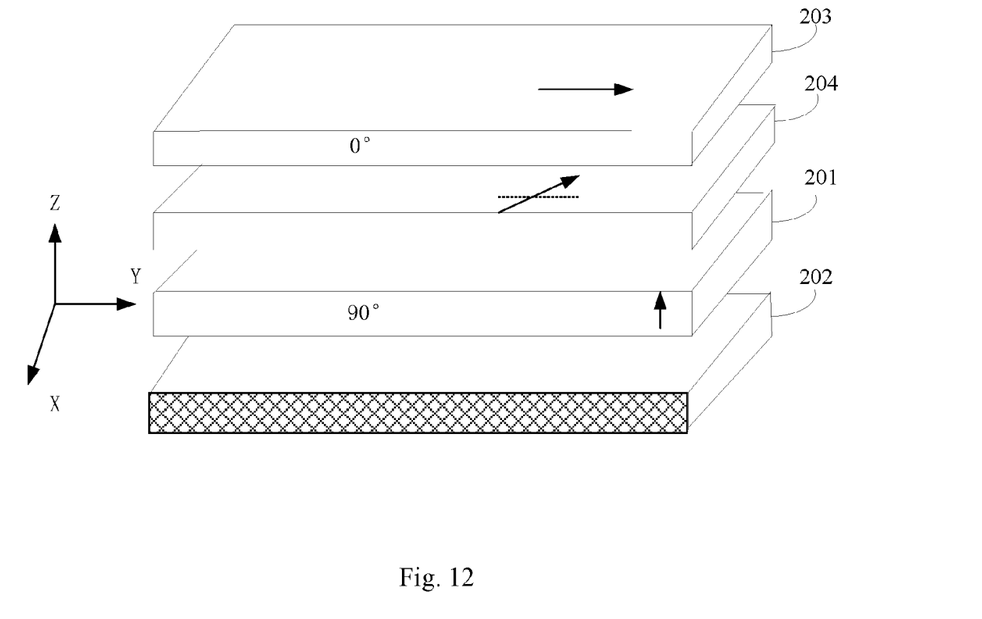
FIG. 12 is a structural schematic view of a display panel provided by another embodiment of the present invention.

FIG. 12 is a narrow viewing angle mode shown according to an embodiment of the present invention. Referring to FIG. 12, which takes the example that the angle between the transmission axis direction of the first polarizing layer 201 and the horizontal direction is 90 degree, the angle between the transmission axis direction of the second polarizing layer 203 and the horizontal direction is 0 degree, and the phase difference film 204 is a quarter wave plate. When the light emitted from the OLED display substrate passes through the first polarizing layer 201, the natural light becomes a first linearly polarized light whose polarizing direction is at an angle of 90 degrees with the horizontal direction, when the first linearly polarized light passes through the phase difference film 204, a second linearly polarized light whose polarizing direction is at a certain angle with the horizontal direction is obtained, when the second linearly polarized light passes through the second polarizing layer 203, since the polarizing direction of the second polarized light is not parallel to the transmission axis direction of the second polarizing layer 203, in the second polarized light, only the light component whose polarizing direction is parallel to the transmission axis direction of the second polarizing layer 203 can pass through the second polarizing layer 203, here, the display panel runs in the narrow viewing angle mode, only the user whose viewing angle is perpendicular to the display panel can see the content in the display panel.

Figure 13:
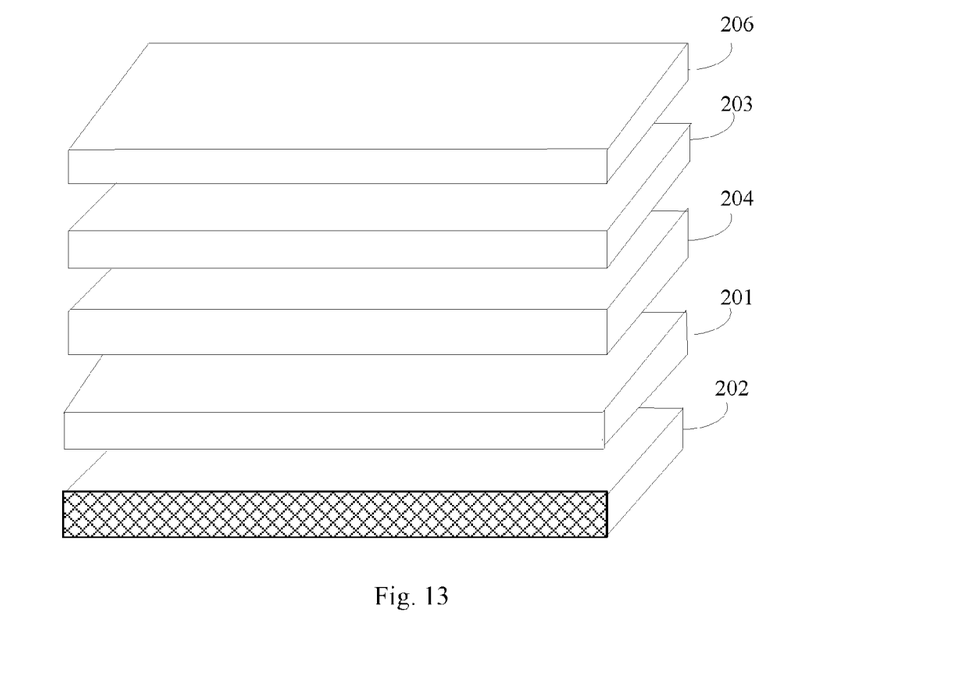
FIG. 13 is a structural schematic view of a display panel provided by another embodiment of the present invention.
Figure 14:
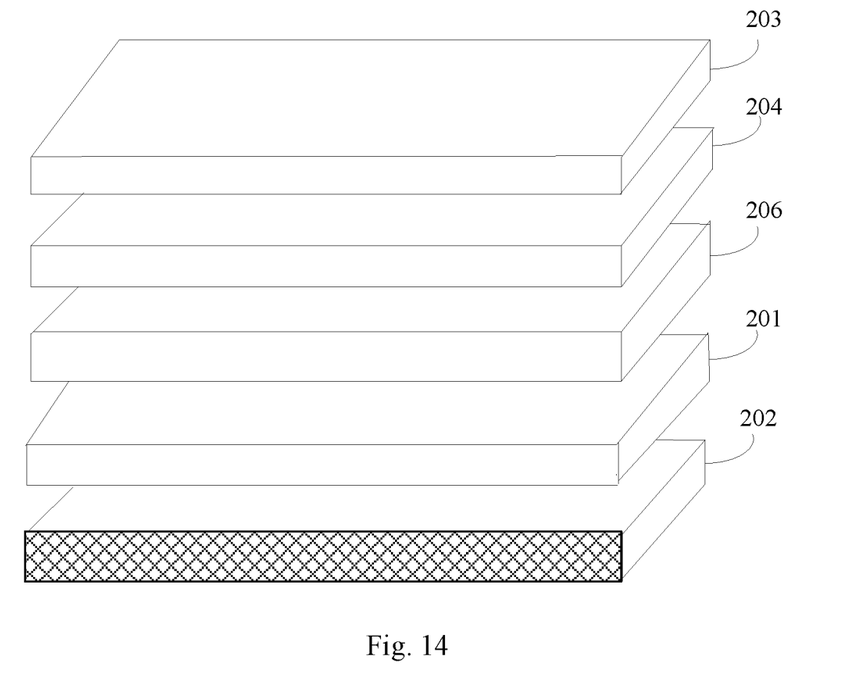
FIG. 14 is a structural schematic view of a display panel provided by another embodiment of the present invention.

Based on the display panel as shown in FIG. 2(A), the display panel provided by the embodiment of the present invention can further comprise an optical substrate 206, the optical substrate has the functions of protecting the display panel from being damaged and increasing the transmittance of the incident light etc. The optical substrate 206 can be a touch plate, and can also be protective glass, the embodiment of the present invention does not define the optical substrate 206 specifically. Referring to FIG. 13, the optical substrate 206 can be arranged at the light exit side of the second polarizing layer 203. Referring to FIG. 14, the optical substrate 206 can also be arranged between the light exit side of the first polarizing layer 201 and the phase difference film 204.

In addition, in order to control brightness distribution on the display panel, the angle between the optical axis direction of the phase difference film 204 and the horizontal direction can select an appropriate value based on needs, for example, it can select any angle in the range of 0°~45°.

The display panel provided by the embodiment of the present invention arranges a second polarizing layer and a phase difference film on the basis of the existing display panel, such that only the linearly polarized light whose polarizing direction is parallel to the transmission axis direction of the second polarizing layer can be emitted from the display panel. Hence, the user whose viewing angle is perpendicular to the display panel can see the content in the display panel, while the user whose viewing angle is in other directions cannot see the contents in the display panel, thereby protecting the user's privacy effectively.

An embodiment of the present invention further provides a display device comprising a display panel which can be the display panel as shown in any of the above FIG. 2(A) to FIG. 6 and FIG. 9 to FIG. 14. In actual applications, the display device can be a device having a display screen such as a smart mobile phone, a panel computer, a smart television etc.

It needs to be explained that when the display panel provided by the above embodiment performs display, explanations are only made with the division of the above function modules, in actual applications, the above functions can be assigned to different function modules based on needs for implementing, i.e., dividing the internal structure of the display panel into different function modules to implement all or part of the functions described above. In addition, the display panel embodiments provided by the above embodiments belongs to the same concept, which will not be repeated here.

The ordinary skilled person in the art can understand that all or part of the steps for carrying out the above embodiments can be performed through hardwares, and can also be performed by programs instructing related hardwares, the programs can be stored in a computer readable storage medium, the above mentioned storage medium can be a ROM, a magnetic disk or an optical disk etc.

What are stated above are only part of the embodiments of the present invention, which are not used for limiting the present invention, any modifications, equivalent replacements and improvements made within the spirit and principle of the present invention should be covered within the protection scope of the present invention.

The invention claimed is:

1. A display panel comprising an optical structure for narrow viewing angle and a display substrate for displaying an image,
   wherein the optical structure for narrow viewing angle comprises a first polarizing layer, a second polarizing layer and a phase difference film, so as to achieve a narrow viewing angle mode for the display panel;
   wherein the first polarizing layer is arranged at one side of the display substrate, and the first polarizing layer is arranged between the second polarizing layer and the display substrate, a transmission axis direction of the first polarizing layer and a transmission axis direction of the second polarizing layer are perpendicular to each other;
   the phase difference film is arranged between the first polarizing layer and the second polarizing layer, for changing a polarizing direction of light incident on the phase difference film, the phase difference film including one of a quarter wave plate and a half wave plate,
   wherein the optical structure for narrow viewing angle is free of liquid crystal layer, and the display substrate is free of polarizer.

2. The display panel according to claim 1, wherein the display panel is a liquid crystal display substrate, a display mode of the liquid crystal display substrate is an Advanced Super Dimension Switch (ADS) mode or a Twisted Nematic (TN) mode.

3. The display panel according to claim 2, further comprising a third polarizing layer;
   wherein the first polarizing layer is arranged at a light exit side of the display substrate, the second polarizing layer is arranged at a light exit side of the first polarizing layer;
   the third polarizing layer is arranged at a light entrance side of the display substrate, a transmission axis direction of the third polarizing layer and the transmission axis direction of the first polarizing layer are perpendicular to each other.

4. The display panel according to claim 2, further comprising a third polarizing layer;
   wherein the first polarizing layer is arranged at a light entrance side of the display substrate, the second polarizing layer is arranged at a light entrance side of the first polarizing layer;
   the third polarizing layer is arranged at a light exit side of the display substrate, a transmission axis direction of the third polarizing layer and the transmission axis direction of the first polarizing layer are perpendicular with each other.

5. The display panel according to claim 1, wherein the display panel is an organic light emitting diode (OLED) display substrate.

6. The display panel according to claim 5, wherein the first polarizing layer is arranged at a light exit side of the display substrate, the second polarizing layer is arranged at a light exit side of the first polarizing layer.

7. The display panel according to claim 3, further comprising an optical substrate;
   wherein the optical substrate is arranged at a light exit side of the second polarizing layer or arranged between the light exit side of the first polarizing layer and the phase difference film.

8. The display panel according to claim 4, further comprising an optical substrate;
   wherein the optical substrate is arranged at a light exit side of the third polarizing layer.

9. The display panel according to claim 7, wherein the optical substrate is a touch plate or protective glass.

10. The display panel according to claim 1, wherein the phase difference film is a uniaxial phase difference film.

11. The display panel according to claim 1, wherein the phase difference film is directly adjacent to each of the first polarizing layer and the second polarizing layer.

12. A display device comprising a display panel according to claim 1.

13. The display panel according to claim 6, further comprising an optical substrate;
    wherein the optical substrate is arranged at a light exit side of the second polarizing layer or arranged between the light exit side of the first polarizing layer and the phase difference film.

14. The display panel according to claim 8, wherein the optical substrate is a touch plate or protective glass.

15. The display device according to claim 12, wherein the display panel is a liquid crystal display substrate, a display mode of the liquid crystal display substrate is an Advanced Super Dimension Switch (ADS) mode or a Twisted Nematic (TN) mode.

16. The display device according to claim 15, further comprising a third polarizing layer;
    wherein the first polarizing layer is arranged at a light exit side of the display substrate, the second polarizing layer is arranged at a light exit side of the first polarizing layer;
    the third polarizing layer is arranged at a light entrance side of the display substrate, a transmission axis direction of the third polarizing layer and the transmission axis direction of the first polarizing layer are perpendicular to each other.

17. The display device according to claim 15, further comprising a third polarizing layer;
    wherein the first polarizing layer is arranged at a light entrance side of the display substrate, the second polarizing layer is arranged at a light entrance side of the first polarizing layer;
    the third polarizing layer is arranged at a light exit side of the display substrate, a transmission axis direction of the third polarizing layer and the transmission axis direction of the first polarizing layer are perpendicular with each other.

18. The display device according to claim 12, wherein the display panel is an organic light emitting diode (OLED) display substrate.

19. The display device according to claim 18, wherein the first polarizing layer is arranged at a light exit side of the display substrate, the second polarizing layer is arranged at a light exit side of the first polarizing layer.

20. The display device according to claim 16, further comprising an optical substrate;
    wherein the optical substrate is arranged at a light exit side of the second polarizing layer or arranged between the light exit side of the first polarizing layer and the phase difference film.

* * * * *